US009017563B2

(12) United States Patent
Ushioda et al.

(10) Patent No.: US 9,017,563 B2
(45) Date of Patent: Apr. 28, 2015

(54) PLATING METHOD OF CIRCUIT SUBSTRATE, PRODUCTION METHOD OF PLATED CIRCUIT SUBSTRATE, AND SILVER ETCHING LIQUID

(75) Inventors: Emi Ushioda, Yamaguchi (JP); Tetsuo Imai, Yamaguchi (JP)

(73) Assignee: Tokuyama Corporation, Shunan-shi, Yamaguchi (JP)

( * ) Notice: Subject to any disclaimer, the term of this patent is extended or adjusted under 35 U.S.C. 154(b) by 0 days.

(21) Appl. No.: 13/527,751

(22) Filed: Jun. 20, 2012

(65) Prior Publication Data

US 2013/0048598 A1    Feb. 28, 2013

(30) Foreign Application Priority Data

Jun. 30, 2011    (JP) .................................. 2011-146660

(51) Int. Cl.
| | | |
|---|---|---|
| H01B 13/00 | (2006.01) | |
| C03C 15/00 | (2006.01) | |
| C25D 5/54 | (2006.01) | |
| H01L 21/30 | (2006.01) | |
| C09K 13/00 | (2006.01) | |
| C23G 1/10 | (2006.01) | |
| C23C 22/52 | (2006.01) | |
| C23C 22/63 | (2006.01) | |
| C23G 1/20 | (2006.01) | |
| C23C 18/18 | (2006.01) | |

(Continued)

(52) U.S. Cl.
CPC ............... *C23G 1/103* (2013.01); *C23C 22/52* (2013.01); *C23C 22/63* (2013.01); *C23G 1/20* (2013.01); *C23C 18/1844* (2013.01); *C23C 18/1216* (2013.01); *C23C 18/1651* (2013.01); *H05K 1/0306* (2013.01); *H05K 3/1291* (2013.01); *H05K 2203/0796* (2013.01); *H05K 3/246* (2013.01)

(58) Field of Classification Search
USPC ............. 216/13, 17, 39, 41, 86, 88; 252/79.1, 252/79.2, 79.3, 79.4, 79.5; 438/455, 686, 438/754; 205/162, 164
See application file for complete search history.

(56) References Cited

U.S. PATENT DOCUMENTS 7,219,826 B2 *    5/2007    Nakamura ................. 228/112.1
7,297,413 B2 *    11/2007   Mitsumori ..................... 428/674

(Continued)

FOREIGN PATENT DOCUMENTS

| JP | 04352383 A | 7/1992 |
| JP | 05-226515 A | 3/1993 |

(Continued)

*Primary Examiner* — Nadine Norton
*Assistant Examiner* — Christopher Remavege
(74) *Attorney, Agent, or Firm* — Ladas & Parry LLP

(57) ABSTRACT

Provided is a plating method of a circuit substrate comprising a conductive pattern in which a metal layer containing at least silver and copper is exposed on an outer surface. The plating method comprises: step (A) of treating the circuit substrate with a first liquid agent containing an oxidizing agent; step (B) of treating the circuit substrate after the step (A) with a second liquid agent which dissolves copper oxide, and thereby removing copper oxide from the conductive pattern's surface; step (C) of treating the circuit substrate after the step (B) with a third liquid agent whose rate of dissolving silver oxide (I) at 25° C. is 1000 times or more faster than its rate of dissolving copper (0) at 25° C., and thereby removing silver oxide from the conductive pattern's surface; and step (D) of performing electroless plating on the conductive pattern of the circuit substrate after the step (C).

8 Claims, 6 Drawing Sheets

(51) Int. Cl.
*C23C 18/12* (2006.01)
*C23C 18/16* (2006.01)
*H05K 3/24* (2006.01)
*H05K 1/03* (2006.01)
*H05K 3/12* (2006.01)

(56) References Cited

U.S. PATENT DOCUMENTS 8,366,958 B2 * 2/2013 Chung et al. .......... 252/79.1
8,507,303 B2 * 8/2013 Park ..................... 438/34
2003/0168431 A1 * 9/2003 Lee et al. ............. 216/86
2004/0069528 A1 * 4/2004 Sakuraba et al. ...... 174/257

FOREIGN PATENT DOCUMENTS

| | | |
|---|---|---|
| JP | 2002118085 A | 4/2002 |
| JP | 2003060111 A | 2/2003 |
| JP | 2009224651 A | 10/2009 |
| WO | 2011/108498 A1 | 9/2011 |

* cited by examiner

PLATING METHOD OF CIRCUIT SUBSTRATE, PRODUCTION METHOD OF PLATED CIRCUIT SUBSTRATE, AND SILVER ETCHING LIQUID

TECHNICAL FIELD

The present invention relates to a circuit substrate for mounting thereon an electronic component such as a semiconductor device. More specifically, it relates to a plating method of a circuit substrate, a production method of a plated circuit substrate, and a silver etching liquid.

BACKGROUND ART

An electronic component such as a semiconductor device is usually mounted on a circuit substrate. In general, the circuit substrate comprises an insulating base material and a conductive pattern. Examples of the insulating base material that can be used in the circuit substrate not only include: resin materials such as Bakelite; impregnation materials such as a paper phenol material made by hardening paper with a phenolic resin, and a glass epoxy material made by hardening glass fiber with an epoxy resin; but also include ceramics and glass.

The amount of heat generated by an electronic component, especially a semiconductor device, to be mounted onto a circuit substrate has increased as the performance of the semiconductor device has been enhanced. It is therefore desired to form a circuit substrate from a material that has higher thermal conductivity and a heat radiating capability. In many cases, ceramic substrates, a representative example of which is an alumina sintered body, are used as the circuit substrate material having high thermal conductivity. These days, there are also considerations of using an aluminum nitride sintered body, which has higher thermal conductivity than the alumina sintered body.

In order to produce a circuit substrate by using a sintered nitride ceramic substrate, a typical example of which is this aluminum nitride sintered body, it is necessary to form metal wiring on a surface of the nitride ceramic sintered body. There are severable methods for forming metal wiring, such as a thick-film method in which to apply a metal paste and thereafter perform firing; and a thin-film method in which to form a metal thin film by vapor deposition. Especially in the uses where the heat radiating capability is required, a large amount of electric current is often needed. As the thickness of the film formed by the thin-film method causes limitations on an electric current permitted to flow, the thick-film method is favorably adopted.

Further in the thick-film method, printing methods such as a screen printing method and an ink jet printing method can be adopted as the method of applying the metal paste. Therefore, it is possible to define a shape of a wiring pattern concurrently with forming a layer of a metal material. That is, it is unnecessary to carry out etching treatment and the like after forming the layer of a metal material in order to define the shape of the wiring pattern. As such, costs can be easily reduced, and in view of the cost reductions as well, the thick-film method is favorably adopted.

The following are known as an industrial method for forming metal wiring on a ceramic substrate by the thick-film method: a co-firing method and a post-firing method in which a paste containing a high-melting-point metal powder is used. The co-firing method is a method in which to apply a high-melting-point metal paste onto a ceramic green sheet and fire them to thereby concurrently carry out sintering of the ceramic and firing of the high-melting-point metal. The co-firing method has characteristics that although it enables a solidly adhered metal layer to be formed, it causes difficulty in forming a metal pattern with high dimensional precision due to the shrinkage of the ceramic that results from the sintering thereof. The post-firing method is a method in which to apply a high-melting-point metal paste onto a pre-sintered ceramic substrate and thereafter fire it. This method basically does not entail such a problem of dimensional precision as seen in the above co-firing method. However, especially in the nitride ceramics, a typical example of which is aluminum nitride, it has been difficult to attain high bonding strength (adhesion strength) of the metal layer by the post-firing method. Accordingly, there has recently been suggested a technique (Patent Document 1) of improving the adhesion strength by using a paste containing a Ag—Cu alloy as a main component and titanium hydride as a secondary component.

CITATION LIST

Patent Documents

Patent Document 1: Japanese Patent Application Laid-Open No. 5-226515

SUMMARY OF THE INVENTION

Problems to be Solved by the Invention

On the other hand, in order to mount an electronic component onto a substrate, a metallized part of the substrate needs to be able to solder-mount (die-bond) the electronic component such as a semiconductor device and to electrically connect (wire bond) it. Therefore, in order to enhance the soldering capability and wire bonding capability (for example, bonding strength), a plating treatment is usually given only to the conductive pattern part. Favorable examples of the plating layer structure for enhancing the mounting capability include a structure in which a Au plating is provided on a Ni plating.

After conducting additional tests, the inventors found that in the metallized substrate of Patent Document 1, the adhesion strength of the metallized layer and platability of a surface of the metallized layer sometimes deteriorated (the adhesion strength of a plating layer to the metallized layer degraded, or there was an unplated part). As a result of their studies, the inventors discovered that it was possible to produce a metallized substrate with excellent platability of a surface of a metallized layer, through the steps of: forming a first paste layer containing copper powder and titanium hydride powder on a ceramic substrate to prepare a first layered body; forming a second paste layer containing silver-copper alloy powder on the first paste layer of the first layered body to prepare a second layered body; and firing the second layered body. Then, they filed a patent application (Japanese Patent Application No. 2010-045283).

However, the above method still has several points that need improving for a production method of a plated circuit substrate. In specific, when electroless plating is performed after forming a metallized substrate by the thick film method, the platability of a surface of a metallized layer (conductive pattern) is favorable, but plating deposition sometimes occurs in a part where the metallized layer is not formed (a part where the ceramic is exposed). Products that have plating deposition in the part other than the conductive pattern part as above, may not only have a poor appearance but also a degraded insulating property between the patterns. Consequently, such products need to be disposed of in view of a quality control, thus hindering improvement of the manufacturing yields of the plated circuit substrate.

Accordingly, an object of the present invention is to provide a plating method of a circuit substrate comprising a conductive pattern in which a metal layer containing at least silver and copper is exposed on an outer surface, wherein plating deposition in a part other than the conductive pattern part can be inhibited, and a favorable plating layer can be formed on a surface of the conductive pattern. Further, the present invention provides a production method of a plated circuit substrate; and also provides a silver etching liquid that can be favorably used in the plating method of a circuit substrate of the present invention.

Means for Solving the Problems

As a result of their intensive studies, the inventors have found that the above problems can be solved by subjecting a circuit substrate to predetermined pre-treatment steps in a predetermined order prior to electroless plating, and have completed the present invention.

A first aspect of the present invention is a plating method of a circuit substrate for performing plating on a conductive pattern of a circuit substrate that comprises an insulating base material and the conductive pattern having a metal layer containing at least silver and copper as the outermost layer, the method comprising: a step (A) of treating the circuit substrate with a first liquid agent containing an oxidizing agent; a step (B) of treating the circuit substrate after the step (A) with a second liquid agent which dissolves copper oxide, and thereby removing copper oxide from a surface of the conductive pattern; a step (C) of treating the circuit substrate after the step (B) with a third liquid agent whose rate of dissolving silver oxide (I) at 25° C. is 1000 times or more faster than a rate thereof of dissolving copper (0) at 25° C., and thereby removing silver oxide from the surface of the conductive pattern; and a step (D) of performing electroless plating on the conductive pattern of the circuit substrate after the step (C).

Here, in the present invention, the circuit substrate that comprises a "conductive pattern" means a circuit substrate that has both a part where the surface is coated with a metal layer and a part where the surface is not coated with the metal layer and the insulating base material is exposed. The "conductive pattern having a metal layer containing at least silver and copper as the outermost layer" means that the conductive pattern has a metal layer containing at least silver and copper and that the metal layer is exposed on the outer surface of the circuit substrate. When the conductive pattern has a layered structure with a plurality of metal layers, it means that the layer which is farthest from the insulating base material among the plurality of metal layers constituting the conductive pattern, that is, a layer comprising all the other metal layers constituting the conductive pattern in between the farthest layer and the insulating material is the metal layer containing at least silver and copper. The above conductive pattern also includes a configuration that it consists only of the "metal layer containing at least silver and copper". The term "dissolve" includes dissolution involving oxidation, dissolution involving complex formation, and the like. The "silver oxide (I)" refers to silver oxide which has an oxidation number of +I. The "copper (0)" refers to copper with 0 oxidation number. Further, the "rate of dissolving silver oxide (I)" and the "rate of dissolving copper (0)" refer to a dissolution rate in which an amount of dissolution of silver oxide (I) and of copper (0), respectively, per unit time and per unit surface area is represented by a mole quantity of the metal element.

In the first aspect of the present invention, the step (D) preferably comprises: a step (D1) of performing electroless nickel plating on the conductive pattern of the circuit substrate; and a step (D2) of performing electroless noble metal plating on the conductive pattern of the circuit substrate after the step (D1).

In the present invention, the "noble metal" refers to eight elements that are gold (Au), silver (Ag), platinum (Pt), palladium (Pd), rhodium (Rh), iridium (Ir), ruthenium (Ru), and osmium (Os).

In the first aspect of the present invention, the first liquid agent is preferably an aqueous solution containing one or more selected from permanganates and bichromates.

In the first aspect of the present invention, the second liquid agent is preferably an aqueous solution containing sulfuric acid and hydrogen peroxide.

In the first aspect of the present invention, the third liquid agent is preferably an aqueous solution containing hydrogen peroxide and ammonia.

In the first aspect of the present invention, the third liquid agent preferably dissolves silver oxide (I) at 25° C. at a rate 2500 times or more faster than a rate of dissolving copper (0) at 25° C.

A second aspect of the present invention is a production method of a plated circuit substrate which comprises an insulating base material and a conductive pattern on the insulating base material, the conductive pattern having a metal layer containing at least silver and copper, a surface of the metal layer being plated, the method comprising: a step (X) of producing a circuit substrate comprising an insulating base material and a conductive pattern on the insulating base material, the conductive pattern having a metal layer containing at least silver and copper as the outermost layer; and a step (Y) of performing plating on the conductive pattern of the circuit substrate produced in the step (X), by the plating method of a circuit substrate according to the first aspect of the present invention.

In the present invention, the "plated circuit substrate" refers to a circuit substrate in which the conductive pattern is plated.

In the second aspect of the present invention, the insulating base material may be a ceramic substrate; and the step (X) may comprise: a step (X1) of applying a paste composition containing at least silver and copper onto a surface of a sintered ceramic substrate or of a ceramic green sheet and thereby preparing a circuit substrate precursor; and a step (X2) of firing the circuit substrate precursor prepared in the step (X1) and thereby producing the circuit substrate.

A third aspect of the present invention is a silver etching liquid which dissolves silver oxide (I) at 25° C. at a rate 1000 times or more faster than a rate of dissolving copper (0) at 25° C.

In the third aspect of the present invention, the rate of dissolving silver oxide (I) at 25° C. is preferably $1\times10^{-16}$ mol/s·m$^2$ or more and $1\times10^{-12}$ mol/s·m$^2$ or less.

Effects of the Invention

With the plating method of a circuit substrate according to the first aspect of the present invention, when performing plating on a circuit substrate having a conductive pattern in which a metal layer containing at least silver and copper is exposed on the outer surface, it is possible to inhibit plating deposition on a part other than the conductive pattern part, and to form a favorable plating layer on the surface of the conductive pattern. Thus, the yield can be improved.

In the first aspect of the present invention, the step (D) comprises the above step (D1) and the above step (D2) in this mentioned order, thereby enabling corrosion resistance of the conductive pattern to be enhanced by the presence of the noble metal plating layer. Further, since noble metal to constitute the noble metal plating layer, which is the topmost layer, can be selected adequately as needed, the compatibility with a solder, a bonding wire and the like to be used for mounting an electronic component can be easily improved. Furthermore, with the presence of the nickel plating layer, it is possible to easily enhance the adhesion strength of the noble metal plating layer, to adjust firmness of the conductive pattern, and to prevent migration of copper toward the surface layer.

In the first aspect of the present invention, an aqueous solution containing one or more selected from permanganates and bichromates is employed as the first liquid agent; thereby plating deposition on the part other than the conductive pattern part can be easily inhibited.

In the first aspect of the present invention, an aqueous solution containing sulfuric acid and hydrogen peroxide is employed as the second liquid agent; thereby a favorable plating layer can be formed on the surface of the conductive pattern.

In the first aspect of the present invention, an aqueous solution containing hydrogen peroxide and ammonia is employed as the third liquid agent; thereby a favorable plating layer can be formed on the surface of the conductive pattern.

In the first aspect of the present invention, a liquid agent which dissolves silver oxide (I) at 25° C. at a rate 2500 times or more faster than a rate of dissolving copper (0) at 25° C. is employed as the third liquid agent; thereby a favorable plating layer can be formed on the surface of the conductive pattern even more easily.

According to the production method of a plated circuit substrate of the second aspect of the present invention, plating is performed on the conductive pattern having a metal layer containing at least silver and copper as the outermost layer, by the plating method of a circuit substrate according to the first aspect of the present invention; therefore, it is possible to inhibit plating deposition on the part other than the conductive pattern part, and to form a favorable plating layer on the surface of the conductive pattern. Accordingly, the manufacturing yields of the plated circuit substrate can be improved.

In the second aspect of the present invention, when the insulating base material is a ceramic substrate and the step (X) comprises the above step (X1) and the above step (X2) in this mentioned order, a metallized ceramic circuit substrate with a conductive pattern formed by the thick-film method is produced in the step (X). In the subsequent step (Y) mentioned above, it is possible to inhibit plating deposition on the part other than the conductive pattern part and to form a favorable plating layer on the surface of the conductive pattern. Accordingly, the manufacturing yields of the plated metallized ceramic circuit substrate can be improved.

The silver etching liquid according to the third aspect of the present invention can be used favorably as the above third liquid agent in the plating method of a circuit substrate according to the first aspect of the present invention and in the production method of a plated circuit substrate according to the second aspect of the present invention.

In the third aspect of the present invention, the rate of dissolving silver oxide (I) at 25° C. is set at $1\times10^{-16}$ Mol/s·m$^2$ or more and $1\times10^{-12}$ mol/s·m$^2$ or less; thereby time efficiency in the above step (C) can be easily improved in the plating method of a circuit substrate according to the first aspect of the present invention and in the production method of a plated circuit substrate according to the second aspect of the present invention. Further, as the tolerance for the treatment conditions in the above step (C) can be easily improved, the treatment can be easily controlled.

MODES FOR CARRYING OUT THE INVENTION

Hereinafter, the present invention will be described in detail. The present invention will be described below by giving as an example a flow of producing a plated metallized ceramic circuit substrate from a sintered nitride ceramic substrate. Nitride ceramics have high thermal conductivity; and in a metalizing process thereof, a configuration is favorably adopted in which to form a metallized layer having at least silver and copper co-existing on the metallized surface, and thus it can be considered as a preferred embodiment, but the present invention is not limited to this embodiment. It should be noted that with regard to the numerical values A and B, "A to B" means "A or more and B or less", unless explicitly stated otherwise.

<Production Method of a Plated Metallized Ceramic Circuit Substrate 200>

The production method of a plated circuit substrate of the present invention comprises a step (X) of producing a circuit substrate and a step (Y) of performing plating on a conductive pattern of the circuit substrate.

<Step (X)>

Figure 1:
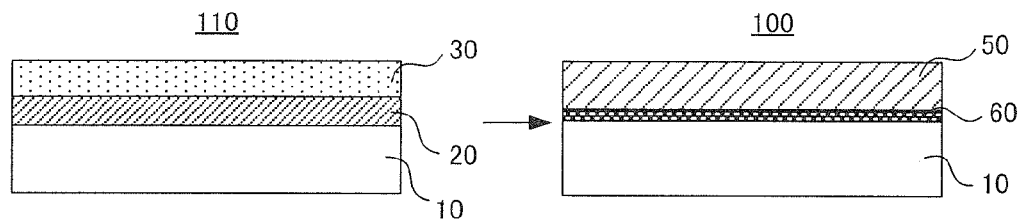
FIG. 1 is a conceptual view illustrating production of a metallized ceramic circuit substrate.

The step (X) is a step of producing a metallized ceramic circuit substrate 100. FIG. 1 shows an outline of a production method of the metallized ceramic circuit substrate 100. The step (X) comprises a step (X1) of making a metallized ceramic circuit substrate precursor 110, and a step (X2) of producing the metallized ceramic circuit substrate 100 from the metallized ceramic circuit substrate precursor 110. These steps will be explained below in the mentioned order.

<Step (X1)>

In the step (X1), a first paste layer 20 is formed on a sintered nitride ceramic substrate 10 and a second paste layer is formed on the first paste layer 20, thereby making the metallized ceramic circuit substrate precursor 110.

(Sintered Nitride Ceramic Substrate 10)

The sintered nitride ceramic substrate 10 can be made by a known method in which to fire a nitride ceramic green sheet having a predetermined shape or a pressure-formed body obtained by pressure-forming nitride ceramic granules. The shape, the thickness and other properties of the sintered nitride ceramic substrate 10 are not particularly limited. The material of the sintered body may contain an ordinarily-used sintering aid such as rare earthes and the like. The surface of the sintered nitride ceramic substrate 10 may be polished as necessary to make it smooth. Examples of nitride ceramics include: aluminum nitride, silicon nitride, boron nitride, zirconium nitride, titanium nitride, tantalum nitride, and niobium nitride. Among these, it is preferable to use aluminum nitride, which has high thermal conductivity and other properties.

(First Paste Layer 20 and Second Paste Layer 30)

A first paste composition containing copper powder and titanium hydride powder is applied onto the sintered nitride ceramic substrate 10, thereby forming the first paste layer 20. After that, a second paste composition containing silver-copper alloy powder is applied onto the first paste layer 20, thereby forming the second paste layer 30. In this manner, the metallized ceramic circuit substrate precursor 110 is produced.

The first paste layer 20 and the second paste layer 30 are formed by applying the below described first paste composition and second paste composition respectively, to an area where one desires to form a wiring pattern. The paste composition is preferably applied by printing in order to form precise wiring. Examples of the printing method that can be adopted include screen printing, ink-jet printing, and offset printing. The paste composition may be adequately adjusted to have the most suitable viscosity in accordance with the printing method to be adopted. However, in a case of employing the screen printing method, in consideration of the operability and pattern reproducibility, it is preferable to use a paste composition in which the amount of each component is adjusted such that the viscosity of the paste composition becomes 50 to 400 Pa·s at 25° C. The following may be carried out: the first paste layer 20 is formed and thereafter it is dried; then the second paste layer 30 is formed and thereafter it is dried. The following may also be carried out: the first paste layer 20 and the second paste layer 30 are formed, after which these paste layers are dried as a whole. The drying method is not particularly limited as long as it can volatilize a solvent in the paste layer. An example may be drying for about one minute to one hour at a temperature of about 80° C. to 120° C.

The metallized ceramic circuit substrate precursor 110 on which the first paste layer 20 containing titanium hydride powder and the second paste layer 30 not containing titanium hydride powder are formed is fired in the below described step (X2), thereby forming a titanium nitride layer 60 and a metal layer 50. This titanium layer 60 is formed at an interface between the nitride ceramic sintered body 10 and the metal layer 50 by the reaction of the titanium component in the first paste layer 20 with the nitrogen component in the sintered nitride ceramic substrate 10.

Further, the presence of the second paste layer 30 not containing titanium hydride powder inhibits the titanium component from migrating to the surface of the metal layer 50 in the below described step (X2), enabling favorable platability of the surface of the metal layer 50, and enabling reduction of craters on the surface of the metal layer 50. Moreover, by inhibiting the titanium component from migrating to the surface of the metal layer 50, the titanium nitride layer 60 can be formed well at the interface between the sintered nitride ceramic substrate 10 and the metal layer 50, and therefore the adhesiveness of the metal layer 50 to the sintered nitride ceramic substrate 10 can be better.

By forming the second paste layer 30 containing silver-copper alloy powder in the step (X1), it is possible to reduce voids in the metal layer 50. That is, by carrying out firing in the step (X2), the silver-copper alloy powder in the second paste layer 30 acts as a brazing material, melting to become a liquid and permeating into the first paste layer 20 to fill the voids in the first paste layer 20; and thereby the voids in the metal layer 50 can be reduced. With reduction of the voids, the adhesiveness of the metal layer 50 can be enhanced. Further, in performing plating over the surface of the metal layer 50 in the below described step (Y), such defects as tarnish and blister can be inhibited.

Further, in cases where only a silver-copper alloy is contained as a metal component of the second paste layer 30, the second paste layer 30, which is an upper layer, melts at the time of firing, functioning as a brazing material, and is absorbed into the first paste layer 20 (which enables the voids in the first paste layer 20 to be filled). Therefore, even when the second paste layer 30 is formed off the edge of the region defined by the first paste layer 20, it is possible to inhibit the metal layer 50 from rising from the sintered nitride ceramic substrate 10 in the area where the titanium nitride layer is not formed due to the absence of the first paste layer 20. Accordingly, overflowing and/or tarnishing of the plating, which is/are caused by a raised metal layer, can be inhibited in the below described step (Y). Furthermore, even in a case of forming the second paste layer 30 smaller than the region defined by the first paste layer 20 for the purpose of strictly preventing the second paste layer from being forced out or overflowing, the second paste layer 30 melts to be eventually absorbed into the first paste layer 20; therefore unevenness is not caused in the metal layer 50 formed, and accordingly the effective utilization area thereof does not decrease.

The thickness of the first paste layer 20 is preferably 3 μm or more and 150 μm or less, and more preferably 5 μm or more and 70 μm or less. The thickness of the second paste layer 30 is preferably 3 μm or more and 150 μm or less, and more preferably 5 μm or more and 70 μm or less. The thickness ratio between the first paste layer 20 and the second paste layer 30 (first paste layer/second paste layer) is preferably 0.1 or more and 10.0 or less, and more preferably 0.2 or more and 5.0 or less.

It should be noted that the thickness of the above first paste layer refers to a thickness of the paste layer after applying the below described first paste composition onto the sintered nitride ceramic substrate 10, drying it, and thereby volatilizing a solvent in the paste layer. In addition, the thickness of the above second paste layer also refers to a thickness of the paste layer after applying the below described second paste composition onto the first paste layer 20, drying it and thereby volatilizing a solvent in the paste layer.

(Paste Composition)

The first paste composition for forming the first paste layer 20 contains copper powder and titanium hydride powder; and in addition to these, it preferably contains a binder, a dispersing agent and a solvent. The second paste composition for forming the second paste layer 30 contains silver-copper powder; and likewise, in addition to these it preferably contains a binder, a dispersing agent and a solvent. As described above, by having the first paste layer 20 contain titanium hydride powder, the adhesiveness of the metal layer 50 is enhanced; therefore, it is unnecessary to add a ceramic powder to the paste composition. Without the ceramic component, which is an insulating component, the electrical conductivity of the metal layer 50 formed can be favorable.

The first paste layer 20 may contain silver powder or silver-copper alloy powder in addition to the above copper powder and titanium hydride powder. In this case, the content of the silver powder or silver-copper alloy powder in the first paste layer 20, to 100 parts by mass of the copper powder, is preferably 1 part by mass or more and 80 parts by mass or less.

Having the first paste layer 20 contain silver powder or silver-copper alloy powder produces advantageous effects of reducing the voids in the metal layer 50 and lowering the resistance value of the metal layer 50. Further, if the amount of the silver powder or silver-copper alloy powder to be mixed therein is excessively large, material costs will increase and there will be an excessively large quantity of liquid phase in the metal layer, thus making it unable to maintain its shape and likely causing problems in forming a precise wiring pattern. Furthermore, the first paste layer 20 may contain both silver powder and silver-copper alloy powder in addition to the above copper powder and titanium hydride powder. In such a case, the content ratio thereof is preferably set, like above, such that the total amount of the silver powder and silver-copper alloy powder, with respect to 100 parts by mass of the copper powder, is preferably 1 part by mass or more and 80 parts by mass or less.

The second paste layer 30 contains silver-copper alloy powder as a metal component. Herein, the silver-copper alloy powder does not mean that there exists silver powder and copper powder individually, but refers to a powder in which copper is added and melted in silver. The second paste layer 30 preferably contains only silver-copper alloy powder as the metal component. With this configuration, the second paste layer 30 melts at the time of firing and is absorbed into the first paste layer 20; therefore rising of the metal layer and decrease in the effective utilization area can be easily inhibited. The silver-copper alloy powder is not particularly limited as long as it melts at a temperature higher than the decomposition temperature of a binder and at a temperature lower than the melting point of copper (1083° C.); however, for example silver-copper alloy powder in which the content rate of the copper component is 20 to 35 mass % is preferred. Above all, an eutectic composition of Ag—Cu, that is, silver-copper alloy powder in which the content rate of the copper component is 28 mass % is preferably used as being capable of easily exerting the above functions, having good operability, and also being easily obtainable.

Furthermore, the second paste layer 30 may contain copper powder in addition to silver-copper alloy powder. In such a case, the content of the copper powder in the second paste layer 30, to 100 parts by mass of the silver-copper alloy powder, is preferably 1 part by mass or more and 300 parts by mass or less. Having the second paste layer 30 contain copper powder produces an advantageous effect that the surface of the metal layer 50 can be made smoother. On the other hand, if the amount of the copper powder to be mixed therein is excessively large, the amount of the alloy decreases relatively; therefore the effect of filling the voids becomes insufficient, likely causing the voids to remain in the metal layer 50. Further, in a case when copper powder is contained in the second paste layer 30, the thickness of the second paste layer 30 is preferably set at 10 μm or more. This is because in a case of using the one having a particle size of about 10 μm as an ordinarily available brazing material, if the thickness of the second paste payer 30 is too thin, the surface smoothness is rather likely to deteriorate. Note that when using the one having a small particle size of 5 μm or less as a brazing material, such a problem does not occur.

As for the first paste composition and second paste composition, the content of the titanium hydride powder in the paste composition forming the first paste layer 20 is preferably 1 part by mass or more and 10 parts by mass or less, based on the total amount, as 100 parts by mass of the copper component and the silver component in the entire paste composition forming the first paste layer and second paste layer. It should be noted that the total amount of the copper component and the silver component means a total of the silver powder, the copper powder, and the silver-copper alloy powder in each paste composition. If the amount of the titanium hydride powder is too small, the adhesiveness of the metal layer 50 after being fired in the below described step (Y) is likely to deteriorate. By contrast, if the amount of the titanium hydride powder is too large, the effect of enhancing the adhesiveness of the metal layer 50 gets saturated and the resistance of the metal layer 50 gets increased; and moreover wettability of the liquid phase generated at the time of firing increases excessively, thus causing the liquid phase component to overflow from the wiring pattern. As a consequence, it tends to become difficult to form a precise wiring pattern. The reason why the total amount of the copper component and the silver component in the entire paste compositions forming the first paste layer 20 and second paste layer 30 is adopted as a reference is because if the second paste layer 30 can be formed thick, the amount of the titanium hydride powder to be added to the first paste layer 20 can be increased.

In the first paste layer 20 and the second paste layer 30 as a whole, the mass ratio between the silver component and the copper component (silver component/copper component) is preferably 0.15 or more and 0.8 or less. If the amount of the silver component is too small, the resistance of the metal layer 50 is likely to increase. By contrast, if the amount of the silver component is too large, material costs will increase and there will be an excessively large quantity of liquid phase in the metal layer 50, thus making it unable to maintain its shape and likely causing problems in forming a precise wiring pattern. Increasing the content of the silver component within the above range produces advantageous effects of reducing the voids in the metal layer 50 and of decreasing the resistance value of the metal layer 50.

In specific, the first paste composition preferably contains titanium hydride powder in an amount of 1.0 part by mass or more and 20.0 parts by mass or less, preferably in an amount of 2.0 parts by mass or more and 15.0 parts by mass or less, with respect to 100 parts by mass of the copper powder.

In addition, the second paste composition preferably employs only silver-copper alloy powder as the metal powder.

The average particle size of the copper powder in the first or second paste composition is not particularly limited; it may be similar to the one employed in the conventional paste. In specific, copper powder having an average particle size of 0.1 μm or more and 5.0 μm or less may be used. Especially, copper powder having an average particle size of preferably 1.0 μm or more and 5.0 μm or less, and more preferably 1.5 μm or more and 3.0 μm or less is favorably employed as the main component. When employing copper powder having an average particle size of 1.0 μm or more and 5.0 μm or less as the main component, copper powder having an average particle size of preferably 0.1 μm or more and less than 1.0 μm, and more preferably 0.2 μm or more and 0.6 μm or less may be contained in a range of less than 50 mass % of the total copper powder.

Further, the average particle size of the silver powder is also not particularly limited; it may be similar to the one usually employed in a metalizing paste. In specific, silver powder having an average particle size of preferably 0.1 μm or more and 5.0 μm or less, and more preferably 0.5 μm or more and 4.0 μm or less may be used.

By using copper powder and silver powder having an average particle size that meets the above range, the printability of screen printing improves and the pattern (metal layer 50) can be inhibited from being forced out. Furthermore, a precise metal layer 50 can be formed. If the metal layer 50 can be formed precisely, it is possible, in forming a plating layer on the metal layer 50, to prevent problems such as tarnish of the metallized layer and blister of the plating layer occurring at the time of heating, which problems are caused by a plating liquid permeating into the metal layer 50 and remaining in the metallized layer.

In addition, the average particle size of the silver-copper alloy powder in the first or second paste composition is also not particularly limited, and it may be similar to the one usually employed in a metalizing paste. In specific, silver-copper alloy powder having an average particle size of preferably 0.1 µm or more and 20 µm or less, and more preferably 0.5 µm or more and 10 µm or less may be used.

Further, the average particle size of the titanium hydride powder in the first paste composition is not particularly limited; it may be similar to the one usually employed in a metalizing paste. In specific, titanium hydride powder having an average particle size of preferably 0.1 µm or more and 20.0 µm or less, and more preferably 0.5 µm or more and 10.0 µm or less may be used. Titanium hydride that is industrially available generally has a wide particle size distribution, and sometimes partially contains coarse particles even if it has an average particle size within the above range. When the coarse particles of the titanium hydride powder are present in the paste composition, unevenness on the surface of the metal layer tends to occur as described below; therefore, it is preferable to use titanium hydride powder having a particle size distribution preferably not containing particles of over 30 µm, and more preferably not containing those of over 20 µm. That is, the upper limit of the titanium hydride powder in a strict sense is preferably 30 µm or less and more preferably 20 µm or less.

It should be noted that the above average particle size and particle size distribution are values (volume average value) measured by laser diffractometry using Microtrac manufactured by Nikkiso Co., Ltd.

As for the binder to be contained in the first or second paste composition, any known binders may be employed without any particular limitations. Examples thereof include: acrylic resins such as polyacrylic acid ester, and polymethacrylic acid ester; cellulose resins such as methylcellulose, hydroxymethylcellulose, ethylcellulose, nitrocellulose and cellulose acetate butyrate; and vinyl-group-containing resins such as polyvinyl butyral, polyvinyl alcohol, and polyvinyl acetate. In addition, in order to improve the printability and the like, two or more resins may be used in a mixture form. Among these, acrylic resins are especially preferred since they produce few residues at a time of carrying out firing in an inert atmosphere.

As for the solvent to be contained in the first or second paste composition, any known solvents may be employed without any particular limitations. Examples thereof include toluene, ethyl acetate, terpineol, butyl carbitolacetate, and texanol. In order to improve the printability, the storage stability and the like, a known surfactant, plasticizer and the like may be added. Examples of the dispersing agent that can be favorably used include those of a phosphate ester type and a polycarboxylic acid type.

(Third Paste Layer 40)

Figure 2A:
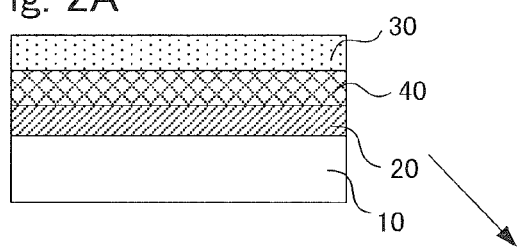
FIG. 2 is a conceptual view illustrating production of a metallized ceramic circuit substrate (a case of forming a third paste layer).
Figure 2B:
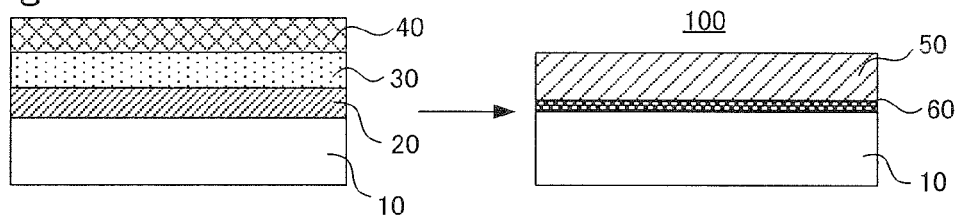
Figure 2C:
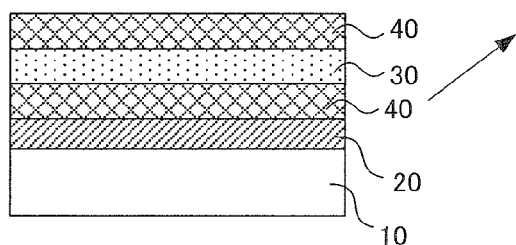

As shown in FIGS. 2A and 2B, in the step (X1), a third paste layer 40 containing copper powder may also be formed between the first paste layer 20 and the second paste layer 30 (FIG. 2A), or on the second paste layer 30 (FIG. 2B). When forming the third paste layer 40 in this manner, there are two configurations of the metallized ceramic circuit substrate precursor before being fired: "sintered nitride ceramic substrate 10/first paste layer 20/third paste layer 40/second paste layer 30" as in FIG. 2A; and "sintered nitride ceramic substrate 10/first paste layer 20/second paste layer 30/third paste layer 40" as in FIG. 2B. A method of forming the third paste layer 40 (application of a paste composition, viscosity of a paste etc.) is similar to the case of the above first paste layer 20. As shown in FIG. 2C, the third paste layer 40 may be formed both between the first paste layer 20 and the second paste layer 30, and on the second paste layer 30.

As described above, the third paste layer 40 is formed between the first paste layer 20 and the second paste layer 30 or on the second paste layer 30, or both. In either case, the third paste layer 40 is formed on the first paste layer 20 containing titanium hydride powder. The presence of this third paste layer 40 containing copper powder on the first paste layer 20 enables reduction of surface roughness of the metal layer 50 which is caused by titanium hydride powder in the first paste layer.

The thickness of the third paste layer 40 is preferably 1 µm or more and 100 µm or less, more preferably 5 µm or more and 50 µm or less, and still more preferably 8 µm or more and 30 µm or less. When forming the third paste layer 40 in two locations as in FIG. 2C, the total layer thickness thereof is preferably within the above range. If the third paste layer 40 is too thin, the effect of making the surface smooth will lessen. By contrast, if it is too thick, the effect of making the surface smooth gets saturated. Moreover, when the third paste layer 40 is formed between the first paste layer 20 and the second paste layer 30, it may hinder the function of the second paste layer 30 dissolved when fired to fill the voids in the first paste layer 20.

Further, the thickness ratio of the third paste layer 40 to the first paste layer 20 (third paste layer/first paste layer) is preferably 0.1 or more and 10.0 or less, and more preferably 0.2 or more and 5.0 or less.

It should be noted that in the present invention, the thickness of the third paste layer 40 refers to a thickness of the paste layer after applying the below described third paste composition onto the second paste layer, drying it, and thereby volatilizing a solvent in the paste layer.

The third paste composition to form the third paste layer 40 is similar to the above first paste composition in terms of such characteristics as containing copper powder and also containing a binder, a dispersing agent, and a solvent. The third paste layer 40 may contain silver powder, silver-copper alloy powder and/or titanium hydride powder in addition to copper powder; however, in view of ensuring the surface smoothness, the content rate of the copper powder is preferably 70 mass % or more and 100 mass % or less, based on the total mass (100 mass %) of the metal powder in the third paste composition.

Further, the amount of the titanium hydride powder to be contained in the first paste layer 20 is preferably 1 part by mass or more and 10 parts by mass or less, based on the total mass, as 100 parts by mass, of the copper component and the silver component in the first paste layer 20, the second paste layer 30, and the third paste layer 40 altogether. The average particle size of the metal particles in the third paste layer 40 is similar to that in the case of the above first paste layer 20. Additionally, the mass ratio of the silver component to the copper component (silver component/copper component) in the first paste layer 20, the second paste layer 30, and the third paste layer 40 all together as a whole, is preferably 0.15 or more and 0.8 or less.

<Step (X2)>

In the step (X2), the metallized ceramic circuit substrate precursor 110 prepared in the above step (X1) is fired, thereby producing the metallized ceramic circuit substrate 100. By performing firing, the titanium nitride layer 60 and the metal layer 50 are formed on the sintered nitride ceramic substrate 10. The firing is preferably performed in a heat-resistant container under a non-oxidizing atmosphere.

The non-oxidizing atmosphere may be a vacuum atmosphere, an atmosphere of an inert gas such as argon gas and helium gas, or a hydrogen gas atmosphere. Further, it may be an atmosphere of a mixed gas of an inert gas and hydrogen gas. Of these non-oxidizing atmospheres, a vacuum atmosphere or an atmosphere of a mixed gas of an inert gas and hydrogen gas is preferably adopted. When the firing is performed in a vacuum atmosphere, the vacuum degree is preferably as high as possible in order to prevent a reactive gas such as oxygen and nitrogen in the atmosphere from reacting with titanium. The vacuum degree is preferably $1.33 \times 10^{-1}$ Pa or less and more preferably $1.33 \times 10^{-2}$ Pa or less. The upper limit of the vacuum degree is not particularly limited; however, in view of the industrial production, it is $1.33 \times 10^{-4}$ Pa or more.

The heat-resistant container may be any as long as it is formed of a material that can endure the temperature at which the metallized ceramic circuit substrate precursor 110 is fired; and it preferably does not permit gas transmission, does not generate gas from the container itself, and is highly airtight, even under high temperatures at the time of firing. Specific examples of the material that can be favorably employed for this heat-resistant container include: a sintered body of a nitride such as aluminum nitride, boron nitride, and silicon nitride; a sintered body of an oxide such as alumina, magnesia, and zirconia; a heat-resistant alloy such as Incoloy and Hastelloy; and quartz glass. Among these, the nitride sintered body, which has excellent thermal conductivity, is preferred since it ensures heat evenness in the container at the time of firing.

The heat-resistant container is thought to fulfill a role of blocking the atmosphere near the metallized ceramic circuit substrate precursor 110 in the firing step from the other atmosphere inside the firing furnace, and inhibiting a decomposition material and other pollution sources formed as a result of the binder in the paste decomposing and scattering to re-adhere to the furnace wall etc., from re-scattering with the increase in the temperature inside the firing furnace, and reacting with the titanium component in the first paste layer 20. Therefore, this heat-resistant container is preferably configured such that it can be closed with a lid in order to block the atmosphere near the metallized ceramic circuit substrate precursor 110 in the firing step, from the other atmosphere inside the firing furnace. Further, the heat-resistant container may be a container that can be sealed up completely; but it may also be a container that has an opening to a degree that allows a gas generated by thermal decomposition of the binder in the first paste layer 20, the second paste layer 30, and the third paste layer 40, to be released to the outside of the container.

Further, the shape of the heat-resistant container is preferably in a size that does not cause, in the firing furnace, a distribution of the temperature inside the heat-resistant container. From this point of view as well, the heat-resistant container is preferably a container made of a nitride sintered body, which has excellent thermal conductivity.

The firing may be performed at a temperature of the melting point (1083° C.) of copper or less since the second paste composition contains the silver component. In order to form a high-precision fine wiring pattern, the firing is preferably performed at a temperature of 800° C. or more and 950° C. or less. Raising the firing temperature within the above firing temperature range produces an advantageous effect of decreasing the voids in the metal layer 50. Further, the firing time may be adequately determined depending on the wiring pattern, film thickness and other factors; and it is satisfactory to keep several seconds or more and one hour or less within the above temperature range.

The metal layer 50 formed in this manner does not consist of a silver-copper alloy phase only, but has a part with a composition abundant in silver and a part with a composition abundant in copper. In forming the metal layer 50 by means of firing, the metal component which has once been melted and mixed by being heated solidifies by being cooled.

In this solidification process, separate phases of the silver component and the copper component are easily created; and as a result, there exist in the metal layer 50 separately in a random manner, a part with a composition abundant in silver and a part with a composition abundant in copper.

The plating method of a circuit substrate of the present invention enables formation of a favorable plating layer on the surface of the phase-separated metal layer as above. Hereinafter, the step (Y) will be described in detail.

<Step (Y)>

In the step (Y), plating is performed over the metal layer (hereinafter sometimes referred to as a "conductive pattern 50") of the metallized ceramic circuit substrate 100 (hereinafter sometimes simply referred to as a "circuit substrate 100") produced in the above step (X).

Figure 3:
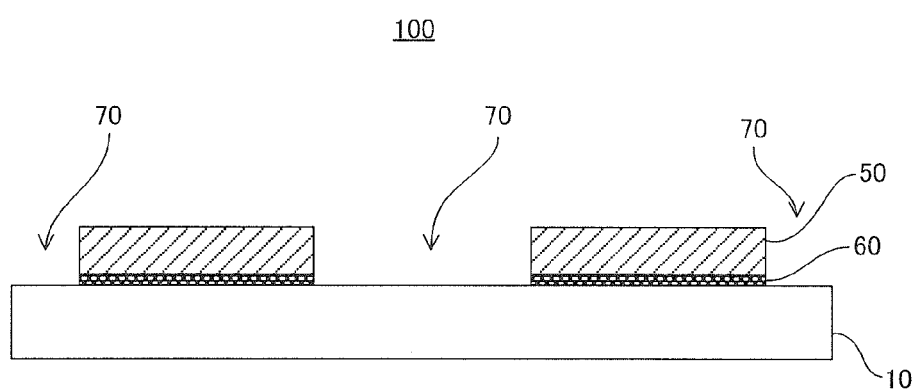
FIG. 3 is a view illustrating a cross section of a metallized circuit substrate.

FIG. 3 schematically shows a cross section of the circuit substrate 100. As shown in FIG. 3, on the surface of the circuit substrate 100 which surface has the conductive pattern 50 formed thereon, there are a part which is covered with the conductive pattern 50, and parts 70, 70 . . . (hereinafter sometimes referred to as "inter-pattern parts 70, 70 . . . ") which are not covered with the conductive pattern 50 and where the sintered nitride ceramic substrate 10 is exposed. As described above, the conductive pattern 50 contains at least silver and copper.

The step (Y) comprises in the following order: a step (A) of treating the circuit substrate 100 with a first liquid agent containing an oxidizing agent; a step (B) of treating the circuit substrate 100 with a second liquid agent which dissolves copper oxide and thereby removing copper oxide from the surface of the conductive pattern 50; a step (C) of treating the circuit substrate 100 with a third liquid agent whose rate of dissolving silver oxide (I) at 25° C. is 1000 times or more faster than its rate of dissolving copper (0) at 25° C., and thereby removing silver oxide from the surface of the conductive pattern 50; and a step (D) of performing electroless plating over the conductive pattern 50. Hereinafter, each of these steps will be described in the mentioned order.

<Step (A)>

The step (A) is a step of treating the circuit substrate 100 with the first liquid agent containing an oxidizing agent.

Figure 4:
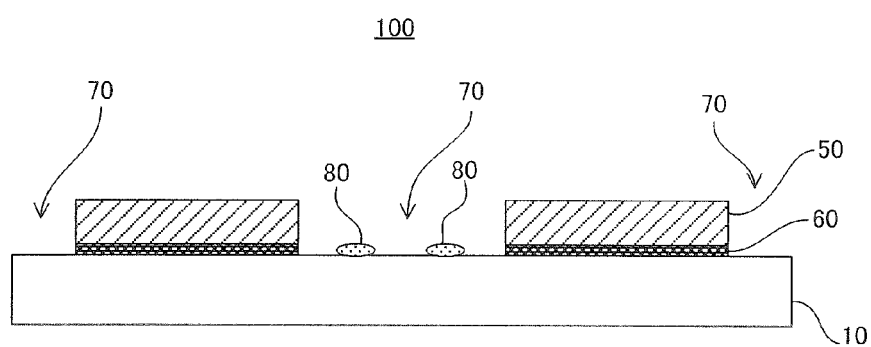
FIG. 4 is view illustrating a case when contaminants are adhered to a metallized ceramic circuit substrate.

FIG. 3 is a view schematically illustrating the cross section of the circuit substrate 100. In the circuit substrate, contaminants are sometimes adhered to the part where the insulating base material is exposed. For example as shown in FIG. 4, in the circuit substrate 100 produced in the above step (X), contaminants 80, 80, . . . are sometimes adhered to the inter-pattern parts 70, 70, . . . where the nitride ceramic substrate 10 is exposed. In the metallized ceramic circuit substrate 100 produced by the thick-film method in the above step (X), the contaminants 80, 80, . . . are often carbonous residues derived from an organic component of the paste composition. The presence of the contaminants (80, 80, . . . ) in the inter-pattern parts (70, 70, . . . ) causes undesired plating deposition in the inter-pattern parts (70, 70, . . . ) where the insulating base material (10) is exposed, when performing an electroless plating treatment.

The inventors make such an assumption as follows about the mechanism in which the contaminants 80, 80, . . . induce plating deposition in the inter-pattern parts 70, 70, . . . . Electroless plating, unlike electrolytic plating, reduces a cation of plating metal (for example, nickel in a case of nickel plating) by the electrons provided from a reducing agent (for example, hypophosphorous acid etc.), not from an electrode, thereby causing plating metal with 0 valence to be deposited onto an object to be plated. Thus, prior to the reaction for actually depositing the plating metal, a treatment is given in which a catalyst (for example, palladium etc.) that facilitates the reaction of the reducing agent is adhered onto the surface of the object to be plated. When the contaminants 80, 80, . . . are adhered to the inter-pattern parts 70, 70, . . . , the catalyst components sometimes remain in (are adsorbed to, for example) the contaminants 80, 80, . . . ; and the catalyst that remains triggers plating deposition in the inter-pattern parts 70, 70, . . . . In addition, when the plating metal is metal (for example, nickel etc.) which has a characteristic of catalyzing the reaction of the reducing agent, the plating metal deposited further catalyzes the reduction reaction; therefore, even if the amount of the contaminants 80, 80, . . . is very small, the plating metal is likely caused to deposit in a large part of the inter-pattern parts 70, 70, . . . .

According to the plating method of a circuit substrate of the present invention, by carrying out the step (A), the contaminants 80, 80, . . . can be removed from the inter-pattern parts 70, 70, . . . , therefore enabling inhibition of plating deposition in the inter-pattern parts 70, 70, . . . as above in performing electroless plating.

(First Liquid Agent)

The first liquid agent contains a solvent and an oxidizing agent dissolved in the solvent. As a requirement, the solvent needs to be capable of dissolving the oxidizing agent. The solvent preferably does not react with the oxidizing agent (or has an extremely slow reaction rate, if any), and preferably has good wettability to the circuit substrate 100. The solvent that can be used in the first liquid agent may be water for example.

Examples of the oxidizing agent that are usable include: permanganates such as sodium permanganate, potassium permanganate, magnesium permanganate, calcium permanganate, barium permanganate, silver permanganate, zinc permanganate, and ammonium permanganate; chromium oxo acids having an oxidation number of +IV, such as bichromates including sodium bichromate, potassium bichromate, and ammonium bichromate, and chromates including sodium chromate, potassium chromate, and ammonium chromate, and salts thereof; perchlorate; and persulfate. Among these, permanganates, bichromates, and chromates are preferred in view of availability and the like; permanganates are more preferred in view of the environment, safety and the like; and above all, potassium permanganate is especially preferred.

As to the concentration of the oxidizing agent in the first liquid agent, the upper limit thereof is limited by the solubility of the oxidizing agent in the solvent; other than that, it may be selected without particular limitations. However, in order to improve time efficiency by shortening the treatment time, the concentration is preferably at a certain level or more. A preferred concentration differs depending on the oxidizing agent; however, in a case when the solvent is water and the oxidizing agent is potassium permanganate, the concentration is preferably 0.5 mass % or more, and more preferably 1 mass % or more. Further, in order to be able to easily control the reaction progress, the concentration is preferably 5 mass % or less, and more preferably 3 mass % or less.

The liquid property of the first liquid agent is not particularly limited. When the oxidizing agent to be contained is an oxidizing agent that requires hydrogen ions in reaction, like permanganates, the liquid is generally made acidic with sulfuric acid in order to improve the oxidation power. However, in the present invention, a basic liquid may be employed even in such a case. By making the liquid basic, it is possible to decrease the rate at which a metal element, especially copper, to constitute the conductive pattern 50 is etched. Thus, favorable platability on the surface of the conductive pattern 50 can be attained in the below described steps (B) and (C); and accordingly, a favorable plating layer can be easily formed in the below described step (D). In a case of making the liquid basic, sodium hydrate, potassium hydrate, and the like may be used as a base, and the pH may be set for example at about 12.

An example of the liquid agent commercially available as an oxidizing-agent-containing liquid agent that can be used as the first liquid agent may be CR-11 manufactured by World Metal Corporation. Further, the first liquid agent may contain a stabilizer as an additive, in addition to the above solvent and oxidizing agent.

(Treatment Conditions)

The step (A) may be carried out by bringing the first liquid agent into contact with the circuit substrate 100. More specifically, the first liquid agent is brought into contact with at least inter-pattern parts 70, 70, . . . , preferably with at least the entire inter-pattern parts 70, 70, . . . of the circuit substrate 100, by such means as dipping, applying, and spraying. In order to be able to easily perform an industrial treatment, the first liquid agent may be brought into contact with the entire circuit substrate 100.

The treatment temperature in the step (A) is not particularly limited. However, in view of for example improving treatment efficiency by improving the reaction rate, it is preferably 10° C. or more, and more preferably 20° C. or more. Further, in order to be able to easily control the progression of the oxidation reaction for example, the treatment temperature is preferably 40° C. or less, and more preferably 30° C. or less.

The treatment time (contact time of the circuit substrate 100 and the first liquid agent) in the step (A) is preferably set in a range that enables the contaminants 80, 80, . . . to be fully removed and that does not cause the conductive pattern 50 to be excessively oxidized. The treatment time may be adequately selected based on the composition and reaction temperature of the first liquid agent. For example, in a case when the solvent is water, the oxidizing agent is potassium permanganate (2 mass %), the pH of the liquid is 12, and the treatment temperature is 25° C., the treatment time may be in a range of one minute or more and 10 minutes or less.

When the above predetermined treatment time has passed after contacting the first liquid agent with the circuit substrate 100, it is preferable to remove the first liquid agent from the surface of the circuit substrate 100 for example by cleaning it with water or the like, in order to completely end the oxidation reaction on the surface of the circuit substrate 100 and to inhibit the liquid agent from being dragged into the next step.

<Step (B)>

The step (B) is a step of treating the circuit substrate 100 after the step (A) with the second liquid agent which dissolves copper oxide, and thereby removing copper oxide from the surface of the conductive pattern 50.

The surface of the conductive pattern 50 of the circuit substrate 100 that has been subjected to the above step (A) has been oxidized by the strong oxidation power of the oxidizing agent contained in the first liquid agent; therefore, at least copper oxide and silver oxide are generated on the surface. As a result, even if plating is performed immediately after the step (A), it is difficult to form a favorable plating layer on the surface of the conductive pattern 50. Therefore, in order to form a favorable plating layer, the above oxides need to be removed from the surface of the conductive pattern 50.

However, after the examinations by the inventors, it was found that since the above oxides were formed in a thick layer form, it was extremely difficult to fully remove them with an ammonium fluoride-hydrochloric acid type liquid agent ordinarily used in a pre-treatment for plating. In addition, it was found that when forming the metal layer 50 in the above step (X), the silver component and the copper component once melted and mixed separated into different phases at the time of solidification due to cooling, as mentioned above, as a result causing a part with a composition abundant in the silver component and a part with a composition abundant in the copper component to exist in the metal layer 50 separately in a random manner. It was also found that as a result of the above phase-separation, the surface of the conductive pattern 50 subjected to the step (A) had, separately in a random manner, apart covered with an oxide mainly composed of silver oxide and a part covered with an oxide mainly composed of copper oxide.

It was discovered that as silver and copper had different oxidation properties and silver oxide and copper oxide had different dissolution properties, it was difficult to remove all of the oxides with one liquid agent. When a layer of one of the oxides remains on the surface of the conductive pattern 50, the platability of the surface of the conductive pattern 50 is not uniform and locally deteriorates significantly due to the phase-separation. Consequently, even if a plating layer can be formed, problems in adhesion of plating metal (for example, Ni) arise on the part with deteriorated platability (part where the oxide remains), causing tarnish and the like. Moreover, it was found that when further performing plating with metal (for example, Au) having a potential nobler than that of the above plating metal, a local battery system (for example, Ni/Au type local battery) was formed on the part with deteriorated platability, causing the underlying plating metal (for example, Ni) to be eroded, consequently causing tarnish and increase in surface roughness on the plating surface.

In view of the above, the inventors have discovered, as a result of their further studies, that by using at least two kinds of liquid agents after the step (A) in a predetermined order, it is possible to remove the above oxides for sure and to attain favorable platability on the surface of the conductive pattern 50, and thereby the above problems can be solved. Specifically, the plating method of a circuit substrate of the present invention enables inhibition of plating deposition in the inter-pattern parts 70, 70, . . . , and enables formation of a favorable plating layer on the conductive pattern 50, by having the step (B) and the below described step (C) carried out in this order after the step (A).

Hereinafter, descriptions of the step (B) will be continued.

(Second Liquid Agent)

The second liquid agent to be used in the step (B) is a liquid agent that can dissolve and remove copper oxide. A liquid agent that is commonly known as a before-plating etching liquid for copper as a single substance may be used as the second liquid agent without particular limitations. For example, a sulfuric acid-hydrogen peroxide type solution may be preferably employed.

When using the sulfuric acid-hydrogen peroxide type solution as the second liquid agent, the concentration of the sulfuric acid may be for example 1 mass % or more and 10 mass % or less. In addition, the concentration of the hydrogen peroxide may be for example 1 mass % or more and 30 mass % or less. The liquid property of the second liquid agent is acidic, and the pH thereof may be for example 2 or more and 5 or less.

An example of the liquid agent which is commercially available as a sulfuric acid-hydrogen peroxide type solution that can be used as the second liquid agent may be CPE-700 manufactured by Mitsubishi Gas Chemical Company, Inc. Further, the second liquid agent may contain a stabilizer as an additive, in addition to the above sulfuric acid and hydrogen peroxide.

(Treatment Conditions)

The step (B) may be carried out by bringing the second liquid agent into contact with the circuit substrate 100. More specifically, the second liquid agent is brought into contact with at least the conductive pattern 50, preferably with at least the entire conductive pattern 50 of the circuit substrate 100, and more preferably with the entire circuit substrate 100, by such means as dipping, applying, and spraying.

The treatment temperature in the step (B) is not particularly limited. However, in view of for example improving treatment efficiency by improving the reaction rate, it is preferably 15° C. or more, and more preferably 20° C. or more. Further, especially when the second liquid agent is a sulfuric acid-hydrogen peroxide type solution, the treatment temperature is preferably 40° C. or less, and more preferably 35° C. or less, in view of the stability and the like of the second liquid agent.

The treatment time (contact time of the circuit substrate 100 and the second liquid agent) in the step (B) is preferably set such that the copper oxide on the surface of the conductive pattern 50 can be fully removed, and more preferably set such that the copper oxide can be removed completely. The treatment time may be adequately selected based on the composition and reaction temperature of the second liquid agent. For example, in a case when the second liquid agent is a sulfuric acid-hydrogen peroxide type solution (sulfuric acid: 2 mass %; hydrogen peroxide: 2.5 mass %) and the treatment temperature is 25° C., the treatment time may be in a range of 10 seconds or more and 300 seconds or less.

When the above predetermined treatment time has passed after contacting the second liquid agent with the circuit substrate 100, it is preferable to remove the second liquid agent from the surface of the circuit substrate 100 for example by cleaning it with water or the like, in order to surely complete removing the copper oxide on the surface of circuit substrate 100 and to inhibit the liquid agent from being dragged into the next step.

<Step (C)>

The step (C) is a step of treating the circuit substrate 100 after the step (B) with the third liquid agent whose rate of dissolving silver oxide is faster than its rate of dissolving copper, and thereby removing silver oxide from the surface of the conductive pattern 50.

In the present invention, the order of carrying out the three steps (A), (B), and (C) is extremely important. If the step (A) is carried out after the step (B) or step (C), the oxides that have been removed in the previous step (B) or (C) will be formed on the conductive pattern 50 again, therefore making it difficult to form a favorable plating layer. Therefore, the step (A) needs to be carried out first of these three steps. Further, if the step (C) is carried out prior to the step (B), silver oxide, even if removed in the step (C), will be produced again in the step (B), causing the surface of the conductive pattern 50 to have a part with locally deteriorated platability. Therefore, in this case as well, it is difficult to form a favorable plating layer.

(Third Liquid Agent)

The third liquid agent is characterized to have a rate of dissolving silver oxide (I) at 25° C. which is 1000 times or more faster than its rate of dissolving copper (0) at 25° C. The third liquid agent preferably has a rate of dissolving silver oxide (I) at 25° C. which is 2500 times or more faster than its rate of dissolving copper (0) at 25° C.; and more preferably has the rate 10000 times or more faster. By setting the relation between the dissolution rates of the silver oxide and of the copper by the third liquid agent in the above mentioned range, it is possible to easily enhance platability on the part of the surface of the conductive pattern 50 which part has a composition abundant in silver, without deteriorating the platability on the part with a composition abundant in copper. Therefore, in the below described step (D), a favorable plating layer can be formed over the entire surface of the conductive pattern 50 even more easily.

Further, the dissolution rate of silver oxide (I) at 25° C. by the third liquid agent is preferably $1\times10^{-16}$ mol/s·m$^2$ or more, and more preferably $2.5\times10^{-15}$ mol/s·m$^2$ or more; and preferably $1\times10^{-12}$ mol/s·m$^2$ or less. In addition, the dissolution rate of the copper (0) at 25° C. by the third liquid agent is preferably $1\times10^{-17}$ mol/s·m$^2$ or less, and more preferably $5\times10^{-18}$ mol/s·m$^2$ or less. By setting the dissolution rate of silver oxide (I) at the above lower limit or more, it is possible to easily improve time efficiency in the below described step (C). Moreover, by setting the dissolution rate of silver oxide (I) at the above upper limit or less, it is possible to easily enhance tolerance to the treatment conditions in the below described step (C); therefore the degree of reaction progress can be easily controlled. Additionally, by setting the dissolution rate of the copper (0) at the above upper limit or less, it is possible to easily keep favorable the surface state of the copper (0) etched in the step (B), and thus possible to easily form a uniform plating layer in the below described step (D).

From the viewpoint that the above conditions of the dissolution rate can be easily satisfied, an aqueous solution containing hydrogen peroxide and ammonia (hereinafter sometimes referred to as a "hydrogen peroxide-ammonia type aqueous solution") for example may be especially favorably adopted as the third liquid agent.

When using the hydrogen peroxide-ammonia type aqueous solution as the third liquid agent, it is preferable for the solution to have the following composition, in order to satisfy the above conditions. That is, the concentration of hydrogen peroxide is preferably 1 mass % or more, more preferably 7 mass % or more, and especially preferably 15 mass % or more. In addition, it is preferably 30 mass % or less, more preferably 25 mass % or less, and especially preferably 23 mass % or less.

Further, the pH of the solution is preferably 7.3 or more, and more preferably 7.8 or more. In addition, it is preferably 10 or less, and more preferably 9.5 or less. By setting the pH at the above lower limit or more, it is possible to easily increase the rate of dissolution reaction of silver oxide (for example, formation reaction with ammonia of a complex ion ($[Ag(NH_3)_2]^+$)); therefore the above conditions of the dissolution rates of silver oxide and of the copper can be easily satisfied. Further, by setting the pH at 10 or less, the reaction speed of the self-decomposition reaction of hydrogen peroxide can be easily decreased. Moreover, by setting the pH at 9.5 or less, the etching rate of copper (0) can be easily decreased. The concentration of ammonia in the solution is preferably a concentration that enables the pH of the solution to have a value within the above range.

When the third liquid agent is the hydrogen peroxide-ammonia type aqueous solution, it may contain phosphoric acid in addition to hydrogen peroxide and ammonia, in order to prevent decomposition of hydrogen peroxide, and the like. In such a case, the concentration of phosphoric acid may be for example 0.2 mass % or more, preferably 0.5 mass % or more; and may be 2 mass % or less, preferably 1.5 mass or less.

(Treatment Conditions)

The step (C) may be carried out by bringing the third liquid agent into contact with the circuit substrate 100. More specifically, the third liquid agent is brought into contact with at least the conductive pattern 50, preferably with at least the entire conductive pattern 50 of the circuit substrate 100, and more preferably with the entire circuit substrate 100, by such means as dipping, applying, and spraying.

The treatment temperature in the step (C) is not particularly limited. However, in view of for example improving treatment efficiency by improving the reaction rate, it is preferably 15° C. or more, and more preferably 20° C. or more. Further, especially when the third liquid agent is the hydrogen peroxide-ammonia type aqueous solution, the treatment temperature is preferably 40° C. or less, and more preferably 30° C. or less, in view of the stability and the like of the third liquid agent.

The treatment time (contact time of the circuit substrate 100 and the third liquid agent) in the step (C) is preferably set such that the silver oxide on the surface of the conductive pattern 50 can be fully removed, and more preferably set such that the silver oxide can be removed completely. The treatment time may be adequately selected based on the composition and reaction temperature of the third liquid agent. For example, in a case when the third liquid agent is the hydrogen peroxide-ammonia type aqueous solution (a solution prepared by adding 20 mass % of hydrogen peroxide, 1 mass % of phosphoric acid, and 30 mass % of ammonia to have a pH of 9.23) and the treatment temperature is 25° C., the treatment time may be in a range of 10 seconds or more and 120 seconds or less.

When the above predetermined treatment time has passed after contacting the third liquid agent with the circuit substrate 100, it is preferable to remove the third liquid agent from the surface of the circuit substrate 100 for example by cleaning it with water or the like, in order to surely complete removing the silver oxide on the surface of circuit substrate 100 and to inhibit the liquid agent from being dragged into the next step.

<Step (D)>

The step (D) is a step of performing electroless plating on the conductive pattern 50 of the circuit substrate 100 subjected to the above steps (A) to (C). The step (D) comprises, in the following mentioned order, a step (D1) of performing electroless nickel plating and a step (D2) of performing electroless noble metal plating. With this configuration of the step (D), the corrosion resistance of the conductive pattern can be enhanced by the presence of a noble metal plating layer. Further, noble metal to constitute the noble metal plating layer, which is the topmost layer, may be selected as necessary; therefore it is possible to enhance the complatibility with a solder, a bonding wire, and the like to be used for mounting an electronic component. Furthermore, with the presence of the nickel plating layer, it is possible to easily enhance the adhesion strength of the noble metal plating layer, to adjust the firmness of the conductive pattern, and to prevent migration of the copper component contained in the metal layer 50 toward the surface layer. Hereinafter, the steps will be described in order.

<Step (D1)>

In the step (D1), electroless nickel plating is performed on the conductive pattern 50 of the circuit substrate 100 after the above steps (A) to (C). As for the reducing agent to be used for the electroless nickel plating, known ones that are usable for electroless nickel plating may be employed without particular limitations. However, in view of the corrosion resistance at the time of performing electroless noble metal plating in the below described step (D2), electroless nickel plating (hereinafter sometimes referred to as "Ni—P plating") which employs hypophosphorous acid as the reducing agent is preferred. Hereinafter, the step (D1) will be described with the Ni—P plating as an example.

(Catalyst)

As described above, on the surface of the conductive pattern 50, there exist, in a finely separate manner, a part with a composition abundant in copper and a part with a composition abundant in silver. As it is relatively difficult to deposit nickel on the part with a composition abundant in copper by Ni—P plating, it is preferable to provide a catalyst to the surface of the conductive pattern 50 before depositing nickel. Providing the catalyst enables nickel to be easily deposited uniformly on the surface of the conductive pattern 50.

Various metal elements such as iron, nickel, cobalt, and palladium are known to have a catalytic effect on hypophosphorous acid; however, in view of providing a catalyst only to the surface of the conductive pattern 50, palladium is preferably employed. When using palladium as a catalyst, by treating the circuit substrate 100 with a palladium-containing solution, it is possible to provide the palladium as a catalyst only to the surface of the conductive pattern 50 of the surfaces of the circuit substrate 100.

The palladium-containing solution to be used for the treatment may be any as long as it contains palladium ions (for example $Pd^{2+}$) or palladium complex ions; and an example thereof may be MSR28 manufactured by C. Uyemura & Co., Ltd., which is commercially available as such a plating liquid. Palladium as a catalyst only needs to be provided in a tiny amount. The treatment conditions may be for example as follows: the treatment temperature of 30° C. and the treatment time of one minute.

Further, it is preferable to remove the palladium-containing solution from the surface of the circuit substrate 100 for example by rinsing it off with water or the like, in order to inhibit the liquid agent from being dragged into the next step.

(Nickel Deposition)

After providing the catalyst, the circuit substrate 100 is brought into contact with the Ni—P plating liquid by such means as dipping, thereby depositing nickel on the conductive pattern 50. As to the Ni—P plating liquid, a known Ni—P plating liquid containing nickel (+II) and hypophosphorous acid may be employed without particular limitations. An example thereof may be KPR manufactured by C. Uyemura & Co., Ltd., which is commercially available as a usable Ni—P plating liquid. The treatment temperature may be for example 75° C. to 85° C. The treatment time may be adequately determined based on the thickness of the nickel layer required in accordance with the purpose for use of the plated circuit substrate.

Further, it is preferable to remove the plating liquid from the surface of the circuit substrate 100 for example by cleaning it with water or the like, in order to inhibit the liquid agent from being dragged into the next step.

<Step (D2)>

In the step (D2), a noble metal plating layer is formed on the surface of the nickel plating layer formed in the above step (D1), by electroless plating. Preferred examples of the noble metal to form the plating layer may be gold (Au), silver (Ag), platinum (Pt), and palladium (Pd). The noble metal plating layer may consist of a single layer; or it may comprise a plurality of plating layers having different metal elements. An especially preferred example of the plating layer structure with a plurality of noble metal plating layers may be a plating layer structure of Ni/Pd/Au, in which a gold plating is provided after a palladium plating. Noble metal to constitute the topmost layer may be adequately selected in accordance with a device to be mounted, a composition of a solder, a material of a bonding wire, and the like.

Hereinafter, a configuration comprising a Ni/Au plating layer structure and a configuration comprising a Ni/Pd/Au plating layer will be described as a first configuration and a second configuration, respectively.

The first configuration is to provide a metal plating directly to the surface of the nickel plating layer formed in the above step (D1), and a known gold plating liquid may be used without particular limitations. An example of the commercially available gold plating liquid usable for gold strike plating may be TSB-72 (treatment temperature: 70° C. to 90° C.; treatment time: 2 minutes to 20 minutes) manufactured by C. Uyemura & Co., Ltd. An example of the commercially available gold plating liquid usable for thick gold plating may be TMX-22 (treatment temperature: 40° C. to 55° C.; treatment time: 2 minutes to 60 minutes) manufactured by C. Uyemura & Co., Ltd. The treatment time may be adequately selected in accordance with the required film thickness of gold.

The second configuration is to perform electroless palladium plating on the surface of the nickel plating layer formed in the above step (D1) and to thereafter perform electroless gold plating on the palladium plating layer; and a known palladium plating liquid and gold plating liquid may be used without particular limitations. An example of the commercially available palladium plating liquid may be TPD-30 (treatment temperature: 40° C. to 65° C.; treatment time: 2 to 30 minutes) manufactured by C. Uyemura & Co., Ltd. Additionally, as for the gold plating liquid, the above described plating liquid for example may be used.

In the above descriptions of the present invention, there has been introduced as an example a configuration of giving a plating treatment to the circuit substrate having a shape of a conductive pattern defined by such a means as printing a paste composition; however the present invention is not limited to this configuration. A configuration may be adopted in which a plating treatment is given to a circuit substrate having a shape of a conductive pattern defined by etching (for example, a circuit substrate having a shape of a conductive pattern defined by giving an etching treatment, by photolithograpy, to the substrate having a metal layer containing silver and copper on one entire surface thereof). Such a plating method of a circuit substrate and production method of a plated circuit substrate are also included in the technical scope of the plating method of a circuit substrate and production method of a plated circuit substrate of the present invention. In a case of forming a conductive pattern by etching as mentioned above, resist residues for example sometimes adhere, as contaminants, to an area where an insulating base material is exposed; and such contaminants can cause plating deposition in an inter-pattern part. The present invention makes it possible to achieve the benefits thereof that even when a conductive pattern is formed by etching, plating deposition in an area where an insulating base material is exposed is inhibited and a favorable plating layer is formed on the conductive pattern.

In the above descriptions of the present invention, there has been introduced as an example a configuration of performing plating treatment on a metallized ceramic circuit substrate produced by the post-firing method; however, the present invention is not limited to this configuration. A configuration may also be adopted in which plating is performed, by the plating method of the present invention, on a metallized ceramic circuit substrate produced by the co-firing method. Such a production method of a plated circuit substrate is also included in the technical scope of the production method of a plated circuit substrate of the present invention.

In the above descriptions of the present invention, a configuration of performing plating on a metallized ceramic circuit substrate has been introduced as an example; however, the present invention is not limited to this configuration. As long as a circuit substrate is provided with a conductive pattern having a metal layer containing silver and copper as the outermost layer, a plating treatment may be given, by the plating method of the present invention, to a circuit substrate comprising an insulating base material constituted by a material other than ceramics. A configuration of producing a circuit substrate comprising an insulating base material constituted by a material other than ceramics and performing plating on the circuit substrate is also included in the technical scope of the production method of a plated circuit substrate of the present invention.

In the above descriptions regarding the production method of a plated circuit substrate of the present invention, there has been introduced, as an example, a configuration of forming two to four paste layers in a manner being layered with each other when producing a metallized ceramic circuit substrate; however, the present invention is not limited to this configuration. A configuration of forming only one paste layer may also be adopted as long as the circuit substrate provided with the conductive pattern which has a metal layer containing silver and copper as the outermost layer is formed. In addition, a configuration of forming five or more paste layers may also be adopted.

In the above descriptions regarding the production method of a plated circuit substrate of the present invention, a configuration of forming a metal layer containing silver, copper, and titanium has been introduced as an example; however, the present invention is not limited to this configuration. As long as a circuit substrate provided with a conductive pattern which has a metal layer containing silver and copper as the outermost layer is formed, it will be included in the technical scope of the production method of a plated circuit substrate of the present invention, regardless of the composition of the paste composition.

In the above descriptions of the present invention, a configuration of forming a plating layer having gold on the topmost layer has been introduced as an example; however, the present invention is not limited to this configuration. Metal to constitute the topmost plating layer is not limited to gold; for example, silver, platinum, palladium, rhodium, iridium etc. may also be adequately selected depending on the use.

Additionally, in the above descriptions of the present invention, a configuration of performing noble metal plating after performing nickel plating has been introduced as an example; however, the plating method of a circuit substrate and production method of a plated circuit substrate of the present invention are not limited to this configuration. In a case of electroless plating, the layer structure of the plating layer may be adequately modified. For example, such configurations as follows are also included in the technical scope of the plating method of a circuit substrate and production method of a plated circuit substrate of the present invention: a configuration of performing noble metal plating by employing a base metal plating other than nickel as the underlying layer; a configuration of not performing noble metal plating; and a configuration of not performing base metal plating such as nickel plating but directly performing noble metal plating.

EXAMPLES

Hereinafter, the present invention will be described in more detail based on Examples and Comparative Examples. However, the present invention is not limited to below Examples.

Example 1 and Comparative Examples 1 to 10

A metallized ceramic circuit substrate was produced by the following procedures, and a plating treatment was given.

Example 1

Preparation of First Paste Composition

A mortar was used to pre-mix 15 parts by mass of copper powder having an average particle size of 0.3 µm, 82 parts by mass of copper powder having an average particle size of 2 µm, and 3 parts by mass of titanium hydride powder having an average particle size of 5 µm, with a vehicle in which polyalkyl methacrylate was dissolved in terpineol; and thereafter a three-roll mill was used to subject the mixture to a dispersion treatment, thereby preparing a first paste composition.

Preparation of Second Paste Composition

A mortar was used to pre-mix Ag—Cu alloy powder (BAg-8; composition: 72 weight % of silver-28 weight % of the copper) having an average particle size of 6 µm, with a vehicle in which polyalkyl methacrylate was dissolved in terpineol; and thereafter a three-roll mill was used to subject the mixture to a dispersion treatment, thereby preparing a second paste composition.

(Production of Metallized Ceramic Circuit Substrate)

The above first paste composition prepared was printed, by screen printing, onto a sintered aluminum nitride substrate (trade name: "SH-30", manufactured by Tokuyama Corporation) having a thickness of 0.64 mm and a size in length and width of 10 mm×15 mm (the pattern being a test pattern having a minimum space of 100 µm and a minimum line of 200 µm); and then dried at 100° C. for 10 minutes to form a first paste layer (the thickness of the first paste layer was 15 µm). At this time, the mass of the first paste layer formed on the substrate was calculated from the change in the mass of the substrate before and after the formation of the first paste layer. Subsequently, the above second paste composition was printed on top of the first paste layer by screen printing; and then dried at 100° C. for 10 minutes to form a second paste layer (the thickness of the second paste layer was 10 µm). At this time, the mass of the second paste layer formed on the substrate was calculated from the change in the mass of the substrate before and after the formation of the second paste layer. The mass ratio was 0.68 between the first past layer and the second paste layer (a mass ratio in terms of a metal component only: second paste layer/first paste layer), excluding the mass of polyalkyl methacrylate used as the binder. When the amount of the titanium hydride powder was calculated from this mass ratio between the first paste layer and the second paste layer, based on the total amount, as 100 parts by mass, of the copper powder and the alloy powder in the first paste layer and the second paste layer together, it was 1.8 parts by mass. Further, the mass ratio between the silver component and the copper component (silver component/copper component) in the first paste layer and the second paste layer together was 0.42.

Subsequently, the workpiece was fired at 850° C. in a vacuum (vacuum degree: $4\times10^{-3}$ Pa to $8\times10^{-3}$ Pa) for 30 minutes to thereby obtain a metallized ceramic circuit substrate. At this time, the substrate was fired in a state that it was accommodated into a setter (airtight container) made of aluminum nitride. The color tone of the metallized surface of the resultant metallized substrate was light orange. The thickness of the metallized layer (metal layer) was 20 μm.

It was confirmed by SEM/EDS (scanning electron microscope/energy dispersive X-ray spectroscopy) that silver and copper were present on the outermost layer as the metal layer.

(Step (A): Treatment with the First Liquid Agent)

The circuit substrate obtained by the above procedures was treated with the first liquid agent containing an oxidizing agent. CR-11 (potassium permanganate content: 2 mass %; pH: 12) manufactured by World Metals Corporation was used as the first liquid agent. After immersing the circuit substrate into the first liquid agent at 25° C. for five minutes, the circuit substrate was removed from the first liquid agent and cleaned with water.

(Step (B): Treatment with the Second Liquid Agent)

The circuit substrate subjected to the step (A) was treated with the second liquid agent of a sulfuric acid-hydrogen peroxide type. CPE-700 (sulfuric acid content: 2 mass %; hydrogen peroxide content: 2.5 mass %) manufactured by Mitsubishi Gas Chemical Company, Inc. was used as the second liquid agent. After immersing the circuit substrate into the second liquid agent at 25° C. for 40 minutes, the circuit substrate was removed from the second liquid agent and cleaned with water.

(Step (C): Treatment with the Third Liquid Agent)

The circuit substrate that had been subjected to the step (B) was treated with the third liquid agent. Used as the third liquid agent was a hydrogen peroxide-ammonia type aqueous solution according to below Example 4 (hydrogen peroxide content: 20 mass %; phosphoric acid: 1 mass %; pH: 8.2; dissolution rate of silver oxide (25° C.): $6.9 \times 10^{-15}$ mol/s·m$^3$; dissolution rate of the copper (25° C.): $1.8 \times 10^{-19}$ mol/s·m$^3$). After immersing the circuit substrate into the third liquid agent at 25° C. for 40 minutes, the circuit substrate was removed from the third liquid agent and cleaned with water.

(Step (D): Plating Treatment)

A treatment of providing a palladium catalyst was given to the circuit substrate subjected to the step (C) to adhere palladium in a catalytic amount to the surface of the conductive pattern. The treatment of providing the palladium catalyst was carried out by using MSR 28 manufactured by C. Uyemura & Co., Ltd. as a plating liquid and immersing the circuit substrate therein at 30° C. for one minute.

After the substituted palladium plating, Ni—P plating was performed to form a nickel plating layer on the conductive pattern. The Ni—P plating was performed by using KPR manufactured by C. Uyemura & Co., Ltd. as a plating liquid and immersing the circuit substrate therein at 82° C. for 15 minutes.

After the Ni—P plating, Pd—P plating was performed to form a palladium plating layer on the nickel plating layer. The Pd—P plating was performed by using TPD-30 manufactured by C. Uyemura & Co., Ltd. as a plating liquid and immersing the circuit substrate therein at 50° C. for 10 minutes.

After the Pd—P plating, Au strike plating was performed to form a thin gold plating layer on the surface of the palladium plating layer. The Au strike plating was performed by using TSB-72 manufactured by C. Uyemura & Co., Ltd. as a plating liquid and immersing the circuit substrate therein at 80° C. for 10 minutes.

After the Au strike plating, thick Au plating was performed to form a gold plating layer on the palladium plating layer. The thick Au plating was performed by using TMX-22 manufactured by C. Uyemura & Co., Ltd. and immersing the circuit substrate therein at 50° C. for 10 minutes.

In the above manner, a plated metallized ceramic circuit substrate was produced which had a plating layer in a layer structure of Ni/Pd/Au, on the metallized pattern.

Comparative Example 1

A plated metallized ceramic circuit substrate was produced in the same manner as in Example 1, except that the circuit substrate was treated by being immersed into an acidic ammonium fluoride aqueous solution (10 g/L of ammonium fluoride; 10 mass % of hydrochloric acid) at 60° C. for 5 minutes, instead of the steps (A) to (C).

Comparative Example 2

A plated metallized ceramic circuit substrate was produced in the same manner as in Example 1, except that the step (B) and step (C) were not carried out.

Comparative Example 3

A plated metallized ceramic circuit substrate was produced in the same manner as in Example 1, except that the step (B) and step (C) were changed to a treatment in which the circuit substrate was immersed into a hydrochloric acid ammonium fluoride aqueous solution (10 g/L of ammonium fluoride; 10 mass % of hydrochloric acid) at 60° C. for 5 minutes.

Comparative Example 4

A plated metallized ceramic circuit substrate was produced in the same manner as in Comparative Example 3, except that the conditions of the treatment by the acidic ammonium fluoride aqueous solution were set at 60° C. and 20 minutes.

Comparative Example 5

A plated metallized ceramic circuit substrate was produced in the same manner as in Example 1, except that the step (c) was not carried out.

Comparative Example 6

A plated metallized ceramic circuit substrate was produced in the same manner as in Comparative Example 5, except that the treatment time in the step (B) was 2 minutes.

Comparative Example 7

A plated metallized ceramic circuit substrate was produced in the same manner as in Example 1, except that the step (B) was not carried out.

Comparative Example 8

A plated metallized ceramic circuit substrate was produced in the same manner as in Example 1, except that the order of carrying out the step (B) and step (C) was reversed.

Comparative Example 9

A plated metallized ceramic circuit substrate was produced in the same manner as in Example 1, except that the hydrogen peroxide-ammonia type aqueous solution according to below Comparative Example 11 was used as the third liquid agent in the step (C), the hydrogen peroxide-ammonia type aqueous solution having a rate of dissolving silver oxide (I) at 25° C. which is 9 times faster than its rate of dissolving copper (0) at 25° C.

Comparative Example 10

A plated metallized ceramic circuit substrate was produced in the same manner as in Example 1, except that the hydrogen peroxide-ammonia type aqueous solution according to below Comparative Example 12 was used as the third liquid agent in the step (C), the hydrogen peroxide-ammonia type aqueous solution having a rate of dissolving silver oxide (I) at 25° C. which is 432 times faster than its rate of dissolving copper (0) at 25° C.

(Evaluation Method)

In Example 1 and Comparative Examples 1 to 10, 200 test samples were made to calculate a frequency of plating deposition in the inter-pattern parts (ceramic-exposed parts), and a frequency of tarnish in the plating layer on the metallized pattern. Results are shown in Table 1. When the plating layer could not be formed on the metallized pattern, a value of the frequency of tarnish is shown as "-", in Table 1.

TABLE 1

|  | Frequency of deposition | Frequency of tarnish |
| --- | --- | --- |
| Example 1 | 0% | 0% |
| Comparative Example 1 | 62% | 0% |
| Comparative Example 2 | 0% | — |
| Comparative Example 3 | 0% | — |
| Comparative Example 4 | 0% | — |
| Comparative Example 5 | 0% | 31% |
| Comparative Example 6 | 0% | 28% |
| Comparative Example 7 | 0% | — |
| Comparative Example 8 | 0% | 28% |
| Comparative Example 9 | 0% | 25% |
| Comparative Example 10 | 0% | 16% |

(Evaluation Results)

Example 1: in the plated metallized ceramic circuit substrate produced in Example 1, plating deposition was not observed in the ceramic-exposed part. Further, a favorable plating layer without tarnish was formed on the metallized pattern.

Comparative Example 1: in the plated metallized ceramic circuit substrate produced in Comparative Example 1, in which the steps (A) to (C) were changed such that the acidic ammonium fluoride aqueous solution was used for the treatment, a favorable plating layer without tarnish was formed on the metallized pattern; however, plating deposition in the ceramic-exposed part could not be prevented.

Comparative Example 2: in Comparative Example 2, in which the steps (B) and (C) were not carried out, plating deposition was not observed in the ceramic-exposed part; however, a plating layer could not be formed on the metallized pattern.

Comparative Example 3: in Comparative Example 3, in which the steps (B) and (C) were changed to the treatment using the acidic ammonium fluoride aqueous solution, plating deposition was not observed in the ceramic-exposed part; however, a plating layer could not be formed on the metallized pattern.

Comparative Example 4: even though the treatment time by the acidic ammonium fluoride aqueous solution in Comparative Example 3 was extended, a plating layer could not be formed on the metallized pattern.

Comparative Example 5: in Comparative Example 5, in which the step (C) was not carried out, plating deposition in the ceramic-exposed part was not observed; and a plating layer was formed on the metallized pattern. However, there was tarnish in the plating layer on the metallized pattern.

Comparative Example 6: even though the treatment time in the step (B) was extended in Comparative Example 5, tarnish in the plating layer could not be prevented.

Comparative Example 7: in Comparative Example 7, in which the step (B) was not carried out, plating deposition was not observed in the ceramic-exposed part; however, a plating layer could not be formed on the metallized pattern.

Comparative Example 8: in Comparative Example 8, in which the order of carrying out the step (B) and the step (C) was reversed, plating deposition was not observed in the ceramic-exposed part. Further, a plating layer was formed on the metallized pattern. However, there was tarnish in the plating layer on the metallized pattern.

Comparative Example 9: in Comparative Example 9, in which the liquid agent having a rate of dissolving silver oxide less than 1000 times (9 times) faster than its rate of dissolving copper was used as the third liquid agent in the step (c), plating deposition was not observed in the ceramic-exposed part. Further, a plating layer was formed on the metallized pattern. However, the effect of removing silver oxide was insufficient, and there was tarnish in the plating layer on the metallized pattern.

Comparative Example 10: in Comparative Example 10, in which the liquid agent having a rate of dissolving silver oxide less than 1000 times (432 times) faster than its rate of dissolving copper was used as the third liquid agent in the step (c), plating deposition was not observed in the ceramic-exposed part. Further, a plating layer was formed on the metallized pattern. However, the effect of removing silver oxide was insufficient, and there was tarnish in the plating layer on the metalized pattern.

Figure 5:
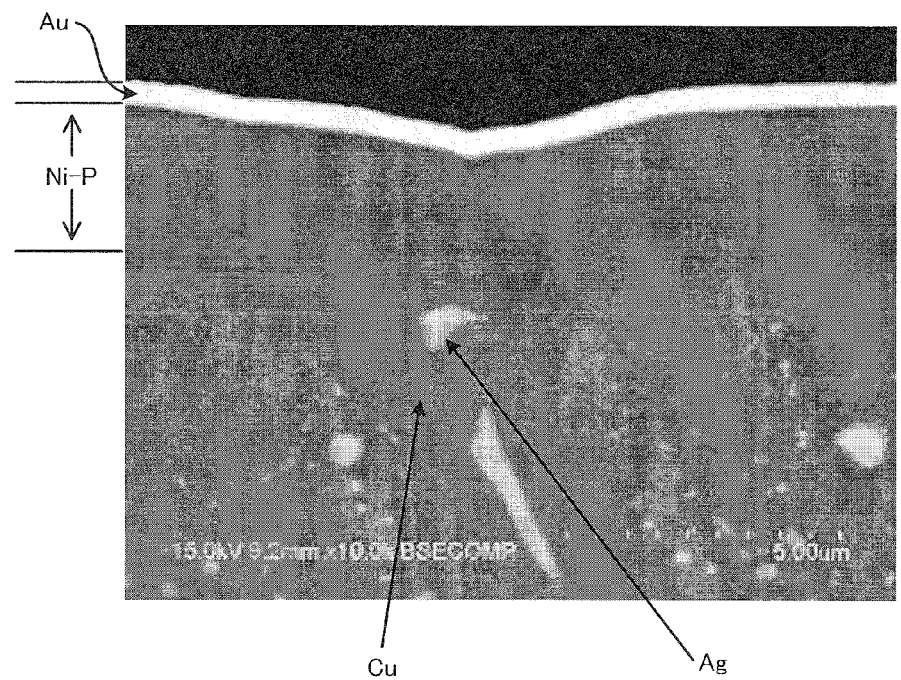
FIG. 5 is a view of a cross section of a circuit part of a plated metallized ceramic circuit substrate of Example 1, observed by a scanning electron microscope (SEM).
Figure 6:
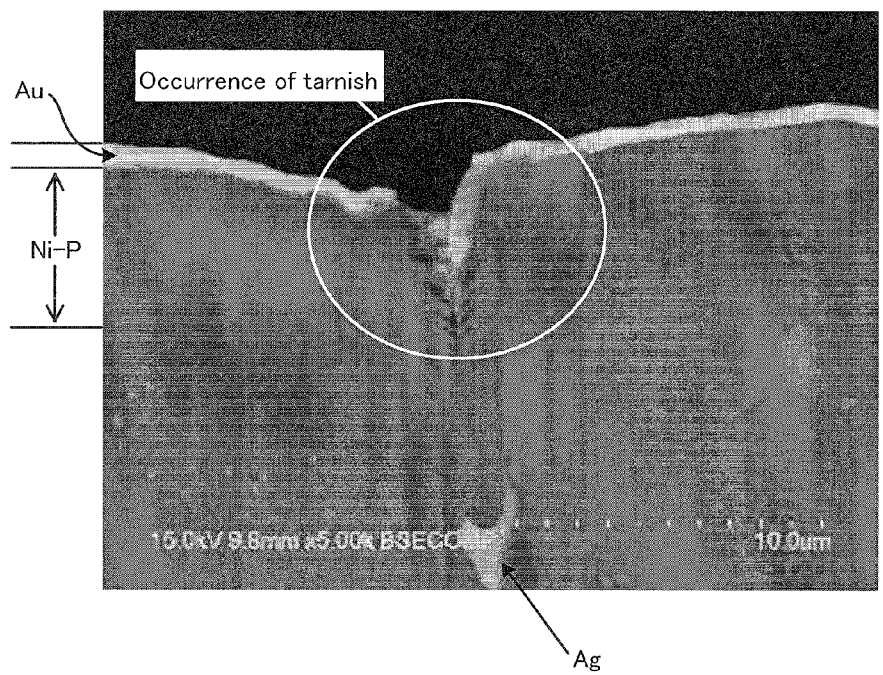
FIG. 6 is a view of a cross section of a circuit part with tarnished plating, of a plated metallized ceramic circuit substrate of Comparative Example 5, observed by a scanning electron microscope (SEM).

FIG. 5 shows an SEM (scanning electron microscope) image of the cross section of the circuit part in Example 1; and FIG. 6 shows an SEM (scanning electron microscope) image of the cross section of the circuit part with tarnish in Comparative Example 5 in which there was tarnish in the plating layer. Since the Pd layer was extremely thin, it cannot be seen in FIGS. 5 and 6.

As shown in FIG. 5, a favorable plating layer was formed in Example 1. On the other hand, as shown in FIG. 6, in Comparative Example 5 the Ni plating in a lower part of the tarnished area started to erode at the part with a composition abundant in Ag of the metallized layer underlying the plating. The reason was because in Comparative Example 5, an oxide film had remained on the part with a composition abundant in Ag prior to Ni—P plating, and thus the Ni plating did not deposit properly; as a consequence, Ni was eroded at the time of Au plating and tarnished.

From the results of Example 1 and Comparative Examples 1 to 8, it is shown that according to the present invention, it is possible to provide a plating method of a circuit substrate which enables inhibition of plating deposition on the part other than the conductive pattern part and formation of a favorable plating layer on the surface of the conductive pattern, in performing plating on the circuit substrate provided with the conductive pattern in which a metal layer containing at least silver and copper is exposed on the outer surface. Further, it is shown that a production method of a plated circuit substrate comprising a step of performing plating by the plating method can be provided.

Examples 2 to 5, Comparative Examples 11 to 13

A test on the silver etching liquid according to the third aspect of the present invention was conducted by the following procedures.
(Evaluation Method)
A liquid in which 1 mass % of phosphoric acid was dissolved in 20 mass % of hydrogen peroxide was prepared. Thereafter, 30 mass % of ammonia water was added thereto so that the pH becomes as shown in Table 2; thereby an etching liquid was prepared. The etching liquid was kept at 25° C., and a copper plate and an oxidized silver plate (which was heated at 300° C. in the atmosphere for 60 minutes) were immersed into the etching liquid and etched. The concentrations of the copper and the silver in the etching liquid after etching were measured by ICP emission spectrometry; and the results were converted into an etching rate (dissolution rate). The results are shown in Table 2.

TABLE 2

| | pH | Rate of dissolving silver oxide (I) (mol/s·m$^2$) | Rate of dissolving copper (0) (mol/s·m$^2$) | Rate of dissolving silver oxide (I)/ Rate of dissolving copper (0) |
|---|---|---|---|---|
| Example 2 | 7.5 | $4.6 \times 10^{-16}$ | $1.1 \times 10^{-19}$ | 4300 |
| Example 3 | 8.0 | $5.3 \times 10^{-15}$ | $1.6 \times 10^{-19}$ | 33000 |
| Example 4 | 8.2 | $6.9 \times 10^{-15}$ | $1.8 \times 10^{-19}$ | 39000 |
| Example 5 | 9.2 | $4.0 \times 10^{-14}$ | $3.4 \times 10^{-18}$ | 11600 |
| Comparative Example 11 | 4.6 | $2.3 \times 10^{-17}$ | $2.5 \times 10^{-18}$ | 9 |
| Comparative Example 12 | 6.5 | $6.7 \times 10^{-17}$ | $1.6 \times 10^{-19}$ | 432 |
| Comparative Example 13 | 10.5 | — | — | — |

Note:
Comparative Example 13 could not be experimented due to strong decomposition of the liquid (Evaluation Results)
It can be understood that in the etching liquids according to Examples 2 to 5, the etching rate of Ag was 1000 times or more higher than the etching rate of Cu, and particularly 2500 times or more higher; and that it can be used effectively as a before-plating silver etching liquid. The etching rate of Ag tended to be faster as the pH increased, and thus it was possible to attain a favorable etching rate of $1 \times 10^{-16}$ mol/s·m$^2$ or more at a pH of 7.3 or more. In the etching liquids according to Comparative Examples 11 and 12 in which the pH was less than 7.3, the etching rate of Ag was slow, and the etching rate ratio between Ag and Cu was less than 1000 times. On the other hand, the etching rate of Cu had a minimal value when the pH was 7.5 to 8.22; as a result, the etching rate ratio between Ag and Cu was maximal when the pH was 8.2. In Comparative Example 13 in which the pH was over 10, it was assumed that the etching rate ratio would be low by the influence of increase in the etching rate of Cu. However, as hydrogen peroxide started to self-decompose prior to measurement of the etching rate, the etching rate thereof could not be measured.

Further, as described above, the etching liquids according to Comparative Examples 11 and 12 were used as the third liquid agent in the above Comparative Examples 9 and 10 in which a plated metallized ceramic circuit substrate was produced. However, since the effect of silver etching was not good enough, the frequency of tranish could not be made 0%.

From the results of Examples 2 to 5 and Comparative Examples 11 to 13, it is shown that with the silver etching liquid of the present invention, it is possible to dissolve silver oxide (I) at 25° C. at a rate 1000 times or more faster than a rate of dissolving copper (0) at 25° C., and accordingly the silver etching liquid can be favorably adopted as the third liquid agent among the before-plating liquids used in the plating method of a circuit substrate and production method of a plated circuit substrate of the present invention.

The present invention has been described above as to the embodiment which is supposed to be practical as well as preferable at present. However, it should be understood that the present invention is not limited to the embodiment disclosed in the specification of the present application and can be appropriately modified within the range that does not depart from the gist or spirit of the invention, which can be read from the appended claims and the overall specification, and a plating method of a circuit substrate, a production method of a plated circuit substrate, and a silver etching liquid, with such modifications are also encompassed within the technical range of the invention.

INDUSTRIAL APPLICABILITY

The plating method of a circuit substrate of the present invention can be favorably employed in performing plating on a conductive pattern of a circuit substrate that has, on its surface having the conductive pattern, a part where an insulating base material is exposed. Further, the production method of a plated circuit substrate of the present invention can be favorably employed in producing a plated circuit substrate that has, on its surface having the conductive pattern, a part where an insulating base material is exposed. Furthermore, the silver etching liquid of the present invention can be favorably employed in performing plating on a circuit substrate by using the plating method of a circuit substrate of the present invention.

DESCRIPTION OF THE REFERENCE NUMERALS

10 sintered nitride ceramic substrate
20 first paste layer
30 second paste layer
40 third paste layer
50 metal layer (conductive pattern)
60 titanium nitride layer
70 inter-pattern part (ceramic-exposed part)
80 contaminant
100 metallized ceramic circuit substrate
110 metallized ceramic circuit substrate precursor

The invention claimed is:
1. A plating method of a circuit substrate for performing plating on a conductive pattern of a circuit substrate which comprises an insulating base material and the conductive pattern having a metal layer containing at least silver and copper as the outermost layer, the method comprising:
   a step (A) of treating the circuit substrate with a first liquid agent containing an oxidizing agent;

a step (B) of treating the circuit substrate after the step (A) with a second liquid agent which dissolves copper oxide, and thereby removing copper oxide from a surface of the conductive pattern;

a step (C) of treating the circuit substrate after the step (B) with a third liquid agent whose rate of dissolving silver oxide (I) at 25° C. is 1000 times or more faster than a rate thereof of dissolving copper (0) at 25° C., and thereby removing silver oxide from the surface of the conductive pattern; and a step (D) of performing electroless plating on the conductive pattern of the circuit substrate after the step (C), wherein where the conductive pattern has a layered structure comprising a plurality of metal layers, the outermost layer is the layer which is farthest from the insulating base material among the plurality of metal layers constituting the conductive pattern.

2. The plating method of a circuit substrate according to claim 1, wherein the step (D) comprises:

a step (D1) of performing electroless nickel plating on the conductive pattern of the circuit substrate; and a step (D2) of performing electroless noble metal plating on the conductive pattern of the circuit substrate after the step (D1).

3. The plating method of a circuit substrate according to claim 1, wherein the first liquid agent is an aqueous solution containing one or more oxidizing agents selected from permanganates and bichromates.

4. The plating method of a circuit substrate according to claim 1, wherein the second liquid agent is an aqueous solution containing sulfuric acid and hydrogen peroxide.

5. The plating method of a circuit substrate according to claim 1, wherein the third liquid agent is an aqueous solution containing hydrogen peroxide and ammonia.

6. The plating method of a circuit substrate according to claim 1, wherein the third liquid agent dissolves silver oxide (I) at 25° C. at a rate 2500 times or more faster than a rate of dissolving copper (0) at 25° C.

7. A production method of a plated circuit substrate which comprises an insulating base material and a conductive pattern on the insulating base material, said conductive pattern having a metal layer containing at least silver and copper, a surface of said metal layer being plated, the method comprising:

a step (X) of producing a circuit substrate comprising an insulating base material and a conductive pattern on the insulating base material, said conductive pattern having a metal layer containing at least silver and copper as the outermost layer; and a step (Y) of performing plating on the conductive pattern of the circuit substrate produced in the step (X), by the plating method of a circuit substrate according to claim 1.

8. The production method of a plated circuit substrate according to claim 7, wherein the insulating base material is a ceramic substrate; and the step (X) comprises:

a step (X1) of applying a paste composition containing at least silver and copper onto a surface of a sintered ceramic substrate or of a ceramic green sheet and thereby preparing a circuit substrate precursor; and a step (X2) of firing the circuit substrate precursor prepared in the step (X1) and thereby producing the circuit substrate.

* * * * *